(12) United States Patent
Yokohari et al.

(10) Patent No.: US 6,985,785 B2
(45) Date of Patent: Jan. 10, 2006

(54) METHOD AND APPARATUS FOR CREATING SHAPE DATA

(75) Inventors: Takashi Yokohari, Iwai (JP); Ichiro Nishigaki, Ishioka (JP); Hiromitsu Tokisue, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/420,903

(22) Filed: Apr. 23, 2003

(65) Prior Publication Data

US 2003/0204279 A1    Oct. 30, 2003

(30) Foreign Application Priority Data

Apr. 24, 2002  (JP) ............................. 2002-121703

(51) Int. Cl.
*G06F 19/00* (2006.01)
(52) U.S. Cl. .................. 700/97; 700/173; 700/179
(58) Field of Classification Search ............... 700/97, 700/98, 159, 173–175, 179
See application file for complete search history.

(56) References Cited

U.S. PATENT DOCUMENTS

2002/0016647 A1 * 2/2002 Bourne et al. ............. 700/165

FOREIGN PATENT DOCUMENTS

| JP | A-08-161378 | 6/1996 |
| JP | A-09-245071 | 9/1997 |
| JP | A-10-207523 | 8/1998 |
| JP | A-10-334127 | 12/1998 |
| JP | A-11-120249 | 4/1999 |
| JP | A-2001-142929 | 5/2001 |
| JP | A-2001-222441 | 8/2001 |
| JP | A-2001-236373 | 8/2001 |

OTHER PUBLICATIONS

U.S. Appl. 09/809,169.
U.S. Appl. 10/289,175.

\* cited by examiner

*Primary Examiner*—Leo Picard
*Assistant Examiner*—Ryan A. Jarrett
(74) *Attorney, Agent, or Firm*—Mattingly Stanger Malur & Brundidge, P.C.

(57) ABSTRACT

A shape data creating apparatus for creating shape data by utilizing a database has an operation measures database. The operation measures database stores attributes of working accuracy, reliability and working cost in a unit of operation of working or assembling. A shape operation measures selecting unit selects a measure used for practical work from a plurality of measure possibly used for working and assembling. A totaling unit calculates workability, assembling efficiency and cost of a shape when working measure and assembling measure selected by consulting attributes stored in the operation measures database are used. A process database stores operation processes of working and assembling. Addition, deletion and order change in an operation process are processed by a shape operation process editing unit.

10 Claims, 15 Drawing Sheets

EXAMPLE OF PROCEDURE FOR GOOD WORKING

| WORKING PROCESS (A) | ACCUMULATED VALUE OF WORKABILITY CORRECTION VALUE | WORKABILITY OF SINGLE PROCESS | VALUE FOR CORRECTING WORKABILITY OF DOWNSTREAM PROCESS |
|---|---|---|---|
| CHAMFERING (CUTTING) | 0.0 | 1.0 | 0.1 |
| BORING | 0.1 | 1.0 | 0.3 |
| BENDING | 0.1+0.3 | 1.0 | 2.0 |
| SUBTOTAL | 0.5 | 3.0 | |
| TOTAL | | 3.5 | |

FIG. 5

| WORKING OPERATION | CRITERION POINT (A) | CORRECTION COEFFICIENT (B) ATTRIBUTABLE TO WORKING SHAPE SIZE | VALUE (A×B) FOR CORRECTING WORKABILITY OF DOWNSTREAM PROCESS |
|---|---|---|---|
| BENDING | 5 | 0.4 | 2.0 |
| BORING | 3 | 0.1 | 0.3 |
| CUTTING | 1 | 0.1 | 0.1 |

FIG. 6A

EXAMPLE OF PROCEDURE FOR GOOD WORKING

| WORKING PROCESS (A) | ACCUMULATED VALUE OF WORKABILITY CORRECTION VALUE | WORKABILITY OF SINGLE PROCESS | VALUE FOR CORRECTING WORKABILITY OF DOWNSTREAM PROCESS |
|---|---|---|---|
| CHAMFERING (CUTTING) | 0.0 | 1.0 | 0.1 |
| BORING | 0.1 | 1.0 | 0.3 |
| BENDING | 0.1+0.3 | 1.0 | 2.0 |
| SUBTOTAL | 0.5 | 3.0 | |
| TOTAL | | 3.5 | |

FIG. 6B

EXAMPLE OF PROCEDURE FOR BAD WORKABILITY

| WORKING PROCESS (B) | ACCUMULATED VALUE OF WORKABILITY CORRECTION VALUE | WORKABILITY OF SINGLE PROCESS | VALUE FOR CORRECTING WORKABILITY OF DOWNSTREAM PROCESS |
|---|---|---|---|
| BENDING | 0.0 | 1.0 | 2.0 |
| BORING | 2.0 | 1.0 | 0.3 |
| CHAMFERING (CUTTING) | 2.0+0.3 | 1.0 | 0.1 |
| SUBTOTAL | 4.3 | 3.0 | |
| TOTAL | | 7.3 | |

FIG. 7

| BORING WORKING MENU | |
|---|---|
| QUALITY OF MATERIAL TO BE WORKED | MA0001 ▼ |
| WORKING DIAMETER | 6 (STANDARDS) ▼ |
| PROCESSING DISTANCE | 20 |
| DETAILED MENU | |
| WORKING SPEED TARGET | UNDESIGNATED ▼ |
| WORKING ACCURACY TARGET | UNDESIGNATED ▼ |
| WORKING COST | 120 |
| (TOOL COST) | 10 |
| (JIG COST) | 10 |

FIG. 8

| CUTTING WORKING MENU | |
|---|---|
| QUALITY OF MATERIAL TO BE WORKED | MA0001 ▼ |
| WORKING DEPTH | 20 ▼ |
| WORKING AREA | 1500 |

| DETAILED MENU | |
|---|---|
| WORKING SPEED TARGET | STANDARD (QUALITY PREFERENCE) ▼ |
| WORKING ACCURACY TARGET | HIGH ACCURACY ▼ |

| WORKING COST | 200 |
|---|---|
| (TOOL COST) | 20 |
| (JIG COST) | 10 |

| WORKING PROCESS | WORKING METHOD (TOOL, ROTATIONAL SPEED, PITCH, ETC.) | WORKING ATTRIBUTE (WORKABILITY, COST, ETC.) |
|---|---|---|
| ROUGH-MACHINING | Φ10F, 1500min$^{-1}$, 0.05m/s, ⋯ | 5.0, 250, ⋯ |
| SEMI-MACHINING | Φ10F, 1500min$^{-1}$, 0.03m/s, ⋯ | 7.0, 350, ⋯ |
| FINISHING | Φ10F, 3000min$^{-1}$, 0.01m/s, ⋯ | 10.0, 500, ⋯ |
| TOTAL | — | 22.0, 1100, ⋯ |

FIG. 11

| GROOVE WORKING MENU | |
|---|---|
| QUALITY OF MATERIAL TO BE WORKED | MA0001 ▼ |
| GROOVE WIDTH | 15 (STANDARDS) ▼ |
| WORKING DEPTH | 20 |
| PROCESSING LENGTH | 200 |
| DETAILED MENU | |
| WORKING SPEED TARGET | HIGH SPEED ▼ |
| WORKING ACCURACY TARGET | STANDARD (SPEED PREFERENCE) ▼ |
| WORKING COST | 100 |
| (TOOL COST) | 10 |
| (JIG COST) | 10 |

METHOD AND APPARATUS FOR CREATING SHAPE DATA

CROSS-REFERENCE TO RELATED APPLICATIONS

The present invention is related to a U.S. Ser. No. 09/809,169 filed Mar. 16, 2001, the entire content of which is incorporated herein by reference, and a U.S. Ser. No. 10/289,175 filed Nov. 7, 2002, the entire content of which is incorporated herein by reference.

BACKGROUND OF THE INVENTION

The present invention relates to a design support apparatus for supporting work to design products and more particularly to method and apparatus for creating shape data.

In recent CAD/CAM/CAE systems, sharing of data has made cooperation among a CAD system, a CAE system and a CAM system extremely intimate. In other words, the flow of processing procedures has been realized substantially in which data for analysis is generated from three-dimensional data created by the CAD system and analyzed/evaluated by the CAE system and then the data is sent to the CAM system to create NC data for production working.

But in creation of the three-dimensional shape data giving a cardinal point of these processes, this type of data is restricted to figure data expressible on a computer and therefore only geometrical information in combination of lines and planes can be inputted. Accordingly, in a step of analytical calculation by the CAE system and in a step of production working by the CAM system, these steps are frequently accompanied by return work to confirm an intention of a design by a designer. Under the circumstances, methods for creating a shape in a unit of working operation of an NC machine in the phase of the three-dimensional CAD system have been proposed in, for example, JP-A-10-207523, JP-A-08-161378 and JP-A-09-245071.

Methods for supporting evaluation of working costs and assembling costs during product design have been disclosed in, for example, JP-A-2001-236373, JP-A-2001-222441 and JP-A-11-120249. In these methods, attributes such as cost and working method are inputted in respect of individual parts of three-dimensional CAD data and are used for calculation of a total cost. Disclosed in JP-A-08-161378, for instance, is a method according to which working costs are calculated in a three-dimensional CAD system by using a cost table corresponding to operations (bending, boring, cutting and the like) for working a plate structure. Also disclosed in, for example, JP-A-2001-142929 and JP-A-10-334127 are methods for calculating estimated costs by changing design parameters (size, quality of material and the like) of a three-dimensional CAD shape template prepared in advance.

For a product, a variety of working methods and assembling methods are available depending on demanded product specifications. There is a demand for a design environment that can take into account such factors as changes in production line, advance in working technology/assembling technology, design changes considering the influence of environment and variations in raw material costs. In order to reduce the return work for confirming a design intention by a designer in the CAE work and production working processes, shape data exhibiting the design intention in a design process must be taken over to the downstream CAE work and production process.

Contrarily, by studying the workability, assembling efficiency and production cost early in the design phase, the total term of product development can be shortened. To this end, a tool is needed which can permit a designer, who is being engaged in design by considering the production process under availability of variations of selectable working and assembling means, to design by studying a variety of working means on the screen and making himself or herself of conscious of working costs and assembling costs.

In the case of a conventional shape data creating method, in a specified working means, parameters such as, for example, the quality of a material to be worked, the tool diameter and the main spindle rotational speed are inputted in a unit of working operation of the NC machine and for example, working costs corresponding thereto are calculated on the basis of a parts table. But a production working method for detailing operation definitions of a cutter in individual phases of rough machining, semi-machining and finishing may preferably be determined in many cases on the CAM system side from the standpoint of high efficiency and work for setting detailed working operations in the phase of the CAD data creation is very laborious and time-consuming.

BRIEF SUMMARY OF THE INVENTION

An object of the present invention is to calculate working and assembling costs during creation of CAD data in a design process and to enable the production working process and assembling process to share a design intention in the design process.

To accomplish the above object, according to one aspect of the invention, in a method for creating shape data by using a three-dimensional CAD, information of means usable in a unit of operation of working or assembling and at least attributes of accuracy and cost in operation are stored in advance in a database, means to be used is selected from the usable means in accordance with a shape of an object subject to shape data creation, attributes of accuracy and cost when the selected means is used are determined by consulting the database, and at least one of workability, assembling efficiency and cost of the shape is calculated on the basis of the consulted attributes.

According to another aspect of the invention, an apparatus for creating shape data by using a three-dimensional CAD comprises an operation means database for storing in advance information of means usable in a unit of operation of working or assembling and at least attributes of accuracy and cost in operation, selection means for selecting means to be used from the useable means in accordance with a shape of an object subject to shape data creation, and totaling means for calculating at least one of workability, assembling efficiency and cost of the object by consulting the operation means database on the basis of attributes of the selected means which have been stored in the database.

In these aspects, display means for comparing and displaying workability, assembling efficiency and cost of shapes concerning candidates for a plurality of working operations or assembling operations may preferably be provided; and preferably, a database for storing information of various kinds of working means and assembling means may be provided, wherein a series of shape operation processes including specified working means or assembling means may be handled as a unit and in this unit, CAD data may be created and workability, assembling efficiency and cost of a product may be evaluated. A plurality of means for obtaining a shape after final working may be selectable on the screen and the working cost and assembling efficiency may be evaluated in accordance with selected means. To facilitate design changes, means for processing addition, deletion and order change of working and assembling processes may also be provided. Further, in order to obtain data of working means or assembling means of desired specifications, new working means or assembling means may be added from an external supplier through the Internet, for instance, the existing data may be updated timely and the database may always be placed in up-to-date condition. The external supplier may include not only other sections or departments of the own firm but also third parties connectable through Internet.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIG. 5 is a table showing an example of parameters for correcting workability.

FIGS. 6A and 6B are tables showing examples of calculation of workability in consideration of the working operation procedures.

FIG. 7 is a diagram showing an example of a boring working menu in the shape working operation.

FIG. 8 is a diagram showing an example of a cutting working menu in the shape working operation.

FIG. 11 is a diagram showing an example of a groove working menu in the shape working operation.

DETAILED DESCRIPTION OF THE INVENTION

Figure 1:
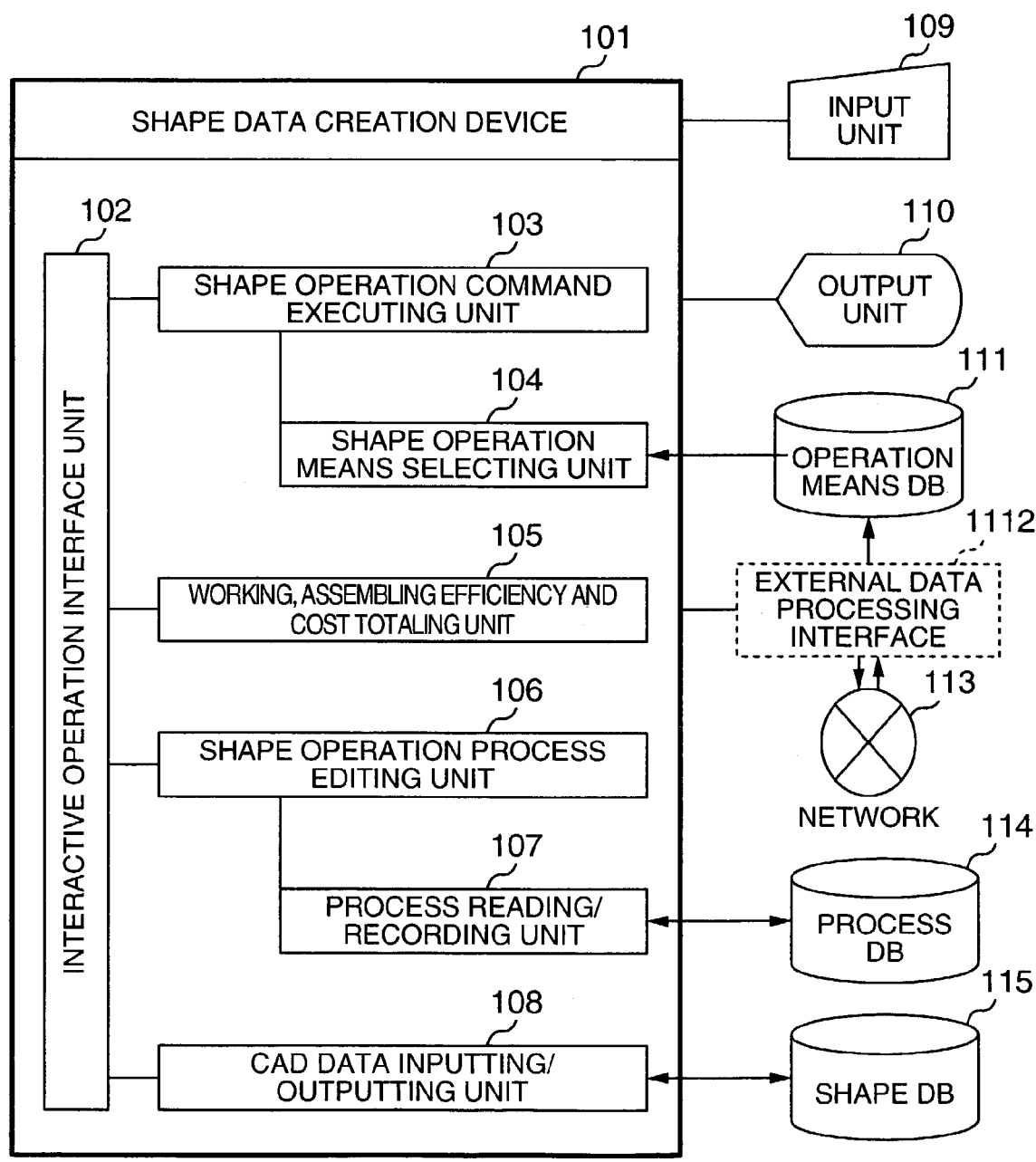
FIG. 1 is a block diagram showing the overall construction of an embodiment of an apparatus for creating shape data according to the invention.

Referring to FIGS. 1 to 19, embodiments of method and apparatus for creating shape data according to the invention will be described. Reference is first made to FIG. 1 showing, in block diagram form, an embodiment of an apparatus for creating shape data according to the invention. The shape data creating apparatus of the present invention comprises shape data creation device 101, an input unit 109, an output unit 110, an operation means database 111, an external data processing interface 112, a process database 114 and a shape database 115.

The shape data creation device 101 includes an interactive interface unit 102, a shape operation command executing unit 103, a shape operating means selecting unit 104, a workability, assembling efficiency and cost totaling unit 105, a shape operation process editing unit 106, a process reading/recording unit 107 and a CAD data inputting/outputting unit 108. The shape data creation device 101 supports or aids a process for creation of three-dimensional CAD data mainly interactively. The interactive operation interface unit 102 interprets commands inputted for creation of the three-dimensional CAD data (shape edition, input/output of shape operation process, edition of shape operation process, input/output of shape data and so on) and controls execution thereof.

The shape operation command executing unit 103 executes working and assembling operations of a shape designated by the interruptive operation interface unit 102. On the basis of instructions delivered out of the shape operation command executing unit 103 and corresponding to working operations such as bending, cutting and boring and assembling operations such as connection, fitting and layout used in creation of shape data using three-dimensional CAD, the shape operation means selecting unit 104 takes out, from the operation means database 111, a plurality of candidates for specified working means or assembling means related to working accuracy, reliability and working cost in the working operation or assembling operation and selects working means or assembling means from the taken out candidates. The workability, assembling efficiency and cost totaling unit 105 operates or calculates individual workability, assembling efficiency and cost obtained from attribute data set in individual shape operation processes (working and assembling processes) to deliver them and besides determines and delivers combined-values of workability, assembling efficiency and cost of a created shape as a whole.

On the basis of needs for design changes, for instance, the shape operation process editing unit 106 deals with addition, deletion and order change of the working operation and assembling operation processes in the creation of the shape data using three-dimensional CAD. The process reading/recording unit 107 performs input/output of the working and assembling processes between the shape operation process editing unit 106 and the process database 114. The process reading/recording unit 107 registers data of shape operation process used in the shape operation process editing unit 106 in the process database 114 and reads history data or the like of processes operated in the past from the process database 114.

The CAD data inputting/outputting unit 108 registers three-dimensional CAD data created by the present system in the shape database 115 while naming it and designates existing CAD data to read it out of the shape database 115. Used as the input unit 109 are a keyboard and a mouse and used as the output unit 110 are a display and a printer. The operation means database 111 is a database for accumulating concrete working means or assembling means selected by the shape operation means selecting unit 104 and corresponding to the working operations such as boring, cutting and bending and the assembling operations such as connection, fitting and layout in the creation of the shape data. The operation means database 111 holds attributes such as working accuracy, reliability and working cost in a unit of working operation and in a unit of assembling operation.

When any data satisfying performance and cost in desired specifications does not exist in the operation means database 111 accumulates working means or assembling means, the external data processing interface 112 makes use of an external supplier through, for example, the Internet 113 to fetch data and update or expand the operation means database 111 for the sake of acquiring requested working means or assembling means, thus making it possible to select suitable working means or assembling means. LAN, the Internet or the like is used as the network 113. The process database 114 accumulates the working operation and assembling operation processes created by the shape operation process editing unit 106 and used for creation of the shape data using three-dimensional CAD so as to reuse them. The shape database 115 stores the three-dimensional CAD data created by the present system.

Conventionally, the cost and workability have been evaluated by using a functional related to a single working operation on the basis of parameters such as for example quality of work material, drill diameter and rotational speed such as rpm. Contrary to this, in the present invention, the operation unit database 111 equipped with a variety of working means and assembling means is provided and a series of processes of working and assembling are handled as a unit. For example, in the case of cutting working, a series of processes ranging from selection of tool and jig necessary for obtaining a specified shape to working of rough-machining and finishing are stored in a unit in the database. As a result, a plurality of means for obtaining a shape after the working can be selectable on the screen and working costs and assembling efficiencies attributable to the individual means can be evaluated.

Figure 2:
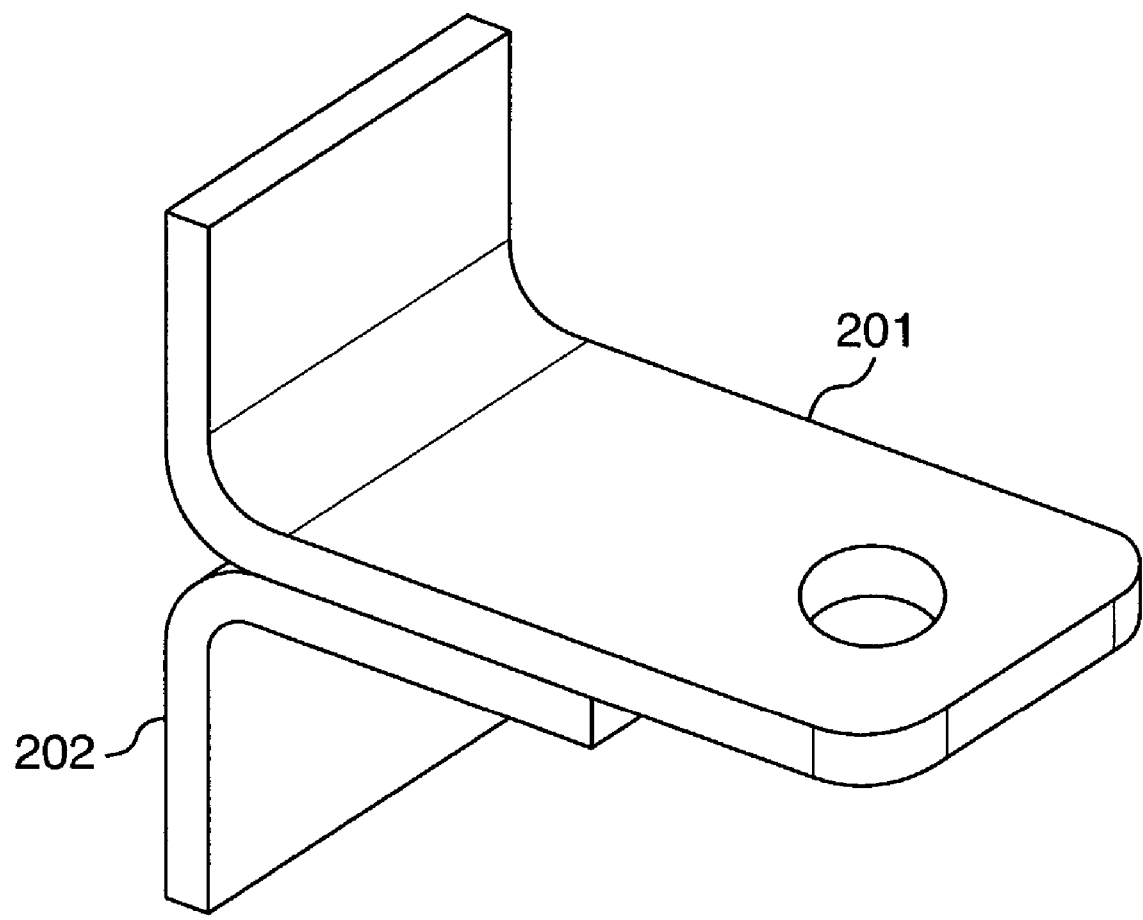
FIG. 2 is a perspective view of an example of a three-dimensional CAD shape of an object to be produced.

Referring to FIG. 2, there is illustrated, in perspective view form, an example of a three-dimensional CAD shape of an object to be produced. The present shape consists of a part 201 and a part 202 and the respective parts are worked separately and then are jointed together in assembling processes. In working operations, commands for bending, boring and cutting are prepared and working means having relation to the quality and cost are associated with the respective working operations. In assembling operations, commands for connection and fitting are prepared and for example, in the case of connection, assembling means such as screwing, welding and bonding are associated with connection means.

Figure 3:
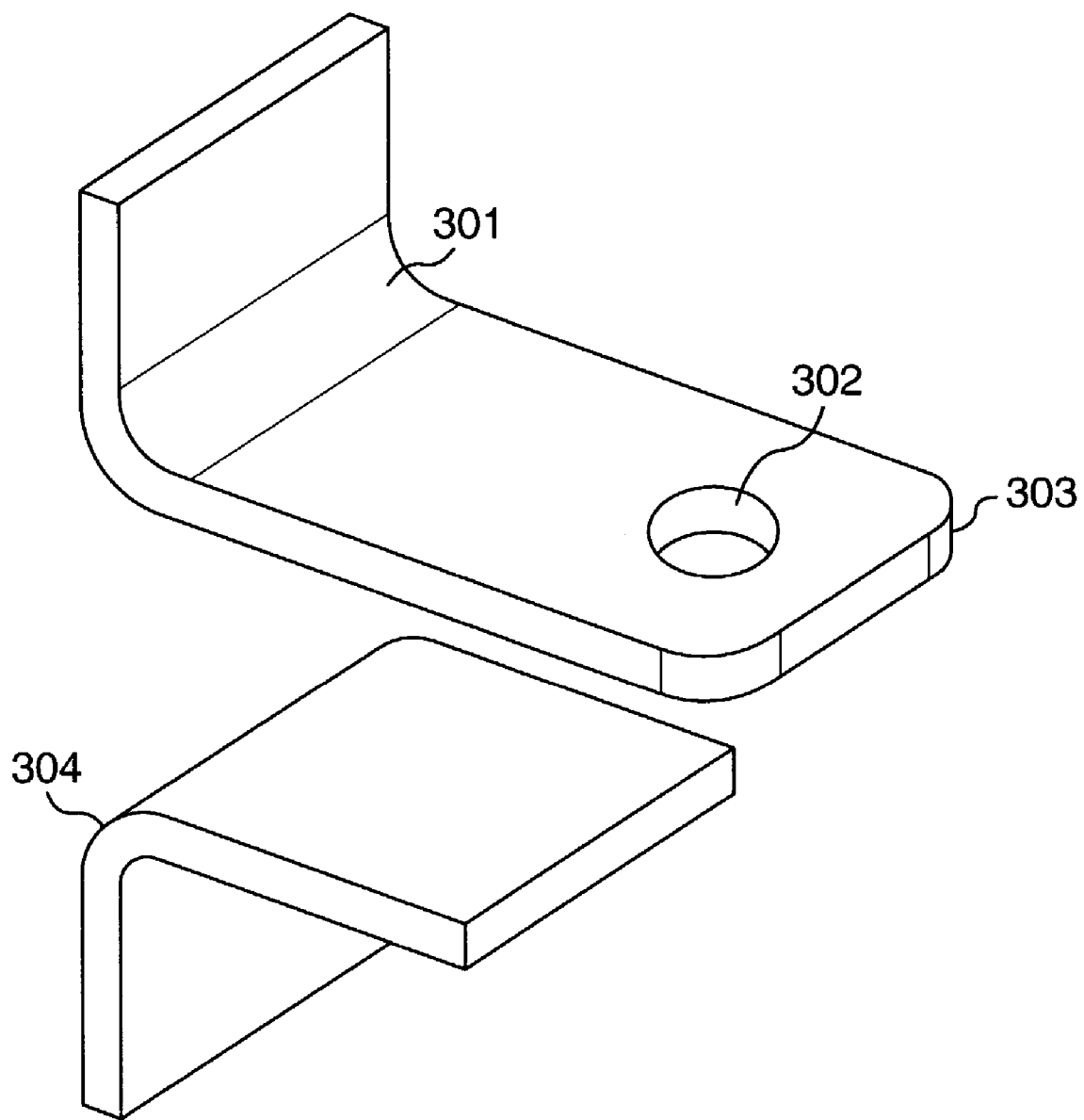
FIG. 3 is an exploded perspective view of the object.

Referring to FIG. 3, the shape of the production object of FIG. 2 is illustrated in perspective view form. In the working operation, such operations as bending 301, boring 302, chamfering 303 by cutting and bending 304 are applied to a plate-like raw material. In the working operation, orders or turns of bending, boring and cutting have relation to the quality, workability, working cost and assembling efficiency required for a product and can be combined in various ways. This holds true for the individual working methods. The present system has information for selection of suitable working conditions by using indices of "working cost is high but workability is good", "workability is good and working cost is low", "workability is bad but working cost is low", "assembling efficiency is good" and "production cost is low".

Figure 4:
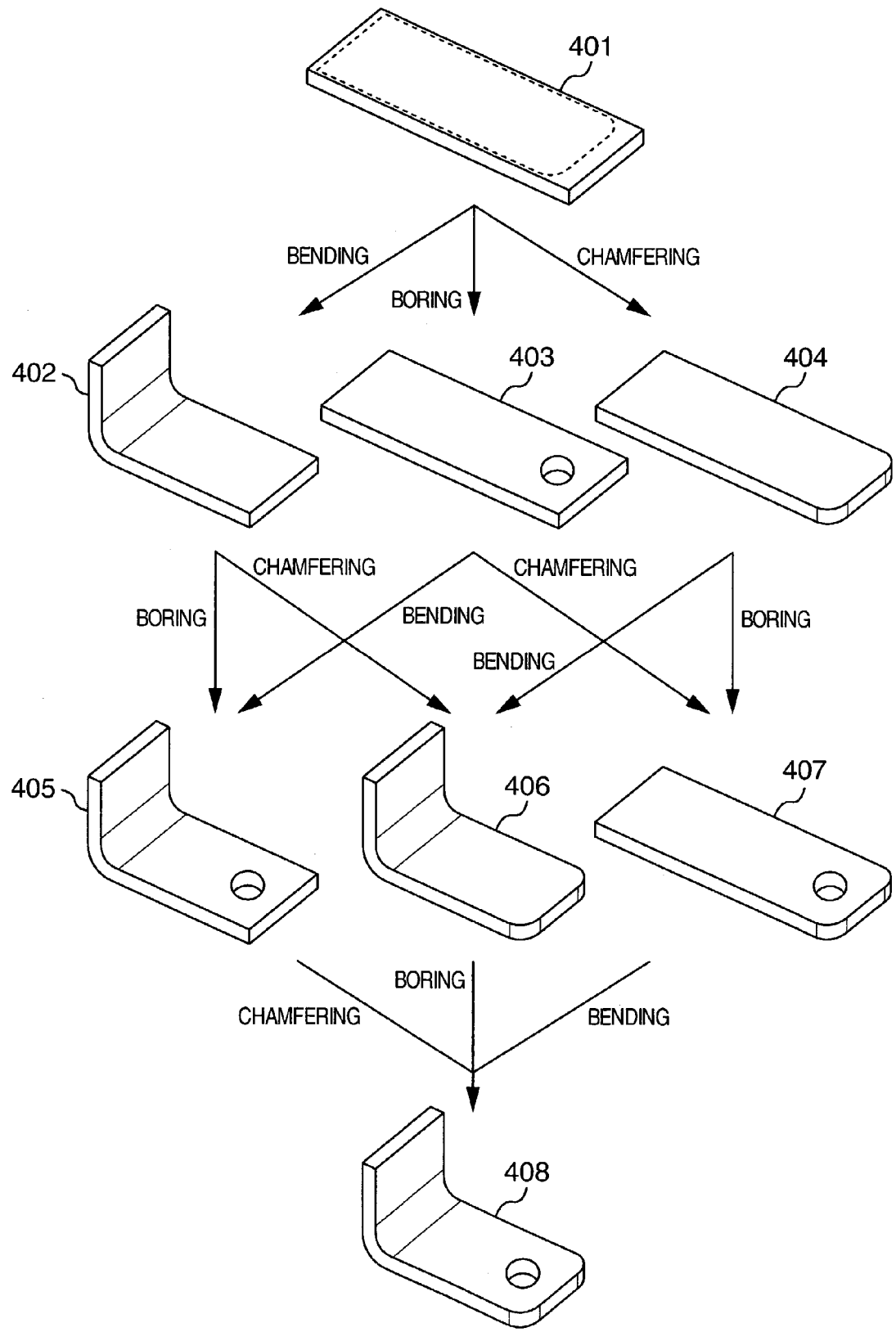
FIG. 4 is a diagram showing working procedures of a part 201 in FIG. 2.

Referring to FIG. 4, a pattern of procedures of working the part 201 in FIG. 2 is diagrammatically illustrated. Broken line on a raw material shape 401 indicates a cutting portion. A member 402 has a shape obtained by applying a bending operation firstly, a member 403 has a shape obtained by applying a boring operation firstly and a member 404 has a shape obtained by applying a chamfering operation firstly. Members 405, 406 and 407 have intermediate shapes obtained by applying, in the next working operations, bending, boring and chamfering in accordance with the immediately preceding states. A member 408 has a final shape obtained by further applying bending, boring and chamfering. The final member 408 is substantially intact even when any processes are taken.

But, a working procedure to be undertaken will differ depending on an intention of product purporting that for example, the first bending makes chamfering and cutting difficult to achieve or that the first boring leads to the succeeding bending positioning which is time-consuming. According to the invention, in order to evaluate the workability and cost when the operation procedure differs as above, means is provided which corrects workability of the working operation process on the downstream side depending on the working operation process on the upstream side.

A table as shown in FIG. 5 indicates an example of parameters for correcting the workability. Criterion point (A) represents the magnitude of an influence an operation of interest has on a downstream operation. Correction coefficient (B) attributable to working shape size is a relative value of a size of a working portion to a size of the whole shape. In the present embodiment, value (A×B) obtained by multiplying the criterion point by the correction coefficient attributable to a working shape size is accumulated each time that a process is added and is sequentially added to a value of workability of the downstream process.

Examples of calculation of workability in consideration of the working operation procedures are shown in FIGS. 6A and 6B. Shown in FIG. 6A is an example in which working proceeds in the example of FIG. 4 in order of members 401~404~407~408. For simplicity of explanation, the workability in each single process is set to 1.0. An accumulated value of working correction value during the first chamfering is 0.0. During the next boring, a workability correction value 0.1 in chamfering is added. Further, during bending, both the chamfering workability correction value 0.1 and a workability correction value 0.3 in boring are both added to provide a total value of workability of 3.5.

Shown in FIG. 6B is an example in which the working proceeds in order of members 401~402~405~408 in the example shown in FIG. 4. As in the case of FIG. 6A, the workability in each single process is set to 1.0. An accumulated value of workability correction value in the first bending is 0.0. During the next boring, a workability correction value of 2.0 in bending is added. Further, during chamfering, both the bending workability correction value 2.0 and boring workability correction value 0.3 are added to provide a total value of working 7.3. In this manner, the workability considering the working operation procedures can be calculated.

In case there is no significant difference in the workability based on the operation procedures, the product of criterion point and correction coefficient attributable to working shape size is further multiplied by a suitable coefficient (0.1 or 10, for example) to let the workability based on the operation procedures have the significant difference. Since the shape operation process of three-dimensional CAD data created in the present CAD system can be take over directly to a process of CAM for actually working a product and can be utilized therein, the design intention during the three-dimensional CAD data creation can be reflected on the production process.

Referring to FIG. 7, there is illustrated an example of a boring working menu in the shape working operation. Quality of a material to be worked, working diameter and processing distance (boring depth) are inputted. If necessary from the standpoint of working specifications, a working speed target and a working accuracy target are further inputted. The operation means database 111 accumulates working accuracy, reliability, working speed, workability and working cost in a unit of a series of working processes or assembling processes. The working accuracy and working speed are manually inputted when the working unit data is registered. The working cost is data obtained by accumulating a working cost determined through the use of an evaluation function on the basis of parameters of material quality, working process, the kind of used tool in respect of a single working operation. As the utilization of the present system proceeds, the operation means database 111 is updated and expanded. To promote the accuracy of cost evaluation, the operator of the system may correct the working cost pursuant to empirical laws.

An example of a cutting working menu in the shape working operation is depicted in FIG. 8. Quality of a material to be worked, working depth and working area are inputted.

Figures 9, 10:
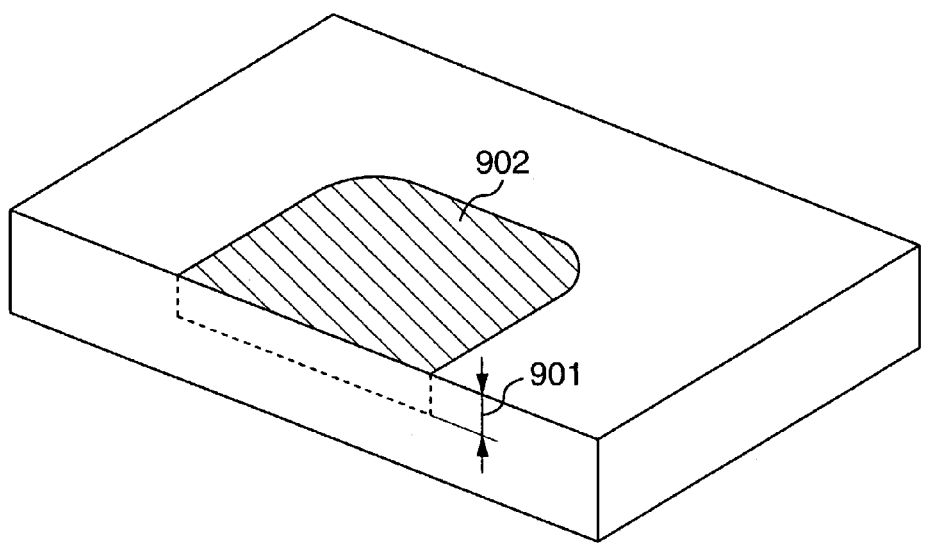
FIG. 9 is a perspective view showing an example of a shape of an object subject to cutting working.
FIG. 10 is a table showing an example of concrete working processes.

An example of shape of an object subject to cutting working is illustrated in FIG. 9. The cutting working object shape is prescribed by parameters of working depth 901 and cutting working area 902. The area of this portion can also be determined easily from the three-dimensional CAD and therefore it may be set automatically. Shown in FIG. 10 is an example of concrete working processes. A working operation is carried out in a unit of a series of processes ranging from rough-machining to finishing by way of semi-machining. Since an operation is performed on the three-dimensional CAD in a unit of complete shape as shown in FIG. 9, an operator of the three-dimensional CAD need not directly be conscious of a working method. The operation means database 111 accumulates a working method as shown in FIG. 10 including tool, main spindle rotational speed and cutting pitch used in the individual processes of rough-machining, semi-finishing and finishing. The working cost in this example can be determined through the above method on the basis of parameters such as the tool, the rotational speed and the cutting pitch. A value obtained by totaling working costs of the individual processes is a working cost of the cutting object shape shown in FIG. 9.

Figure 12:
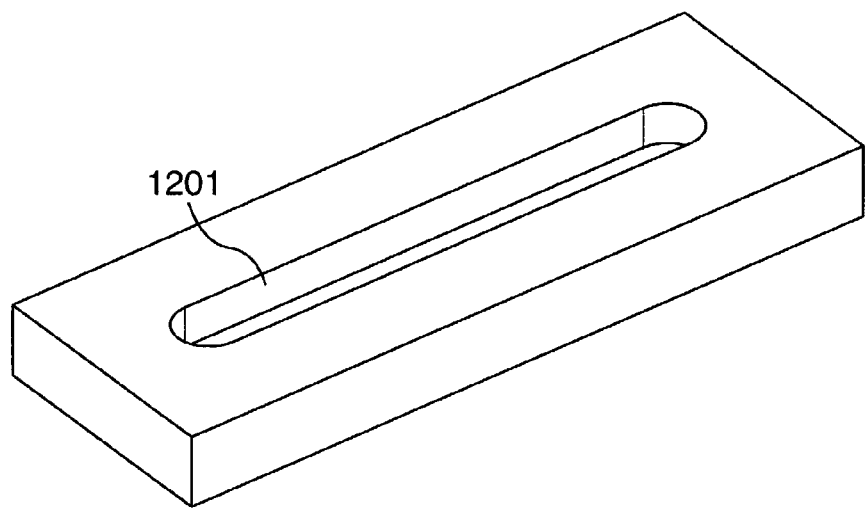
FIG. 12 is a perspective view showing an example of a groove working object shape.
Figure 13:
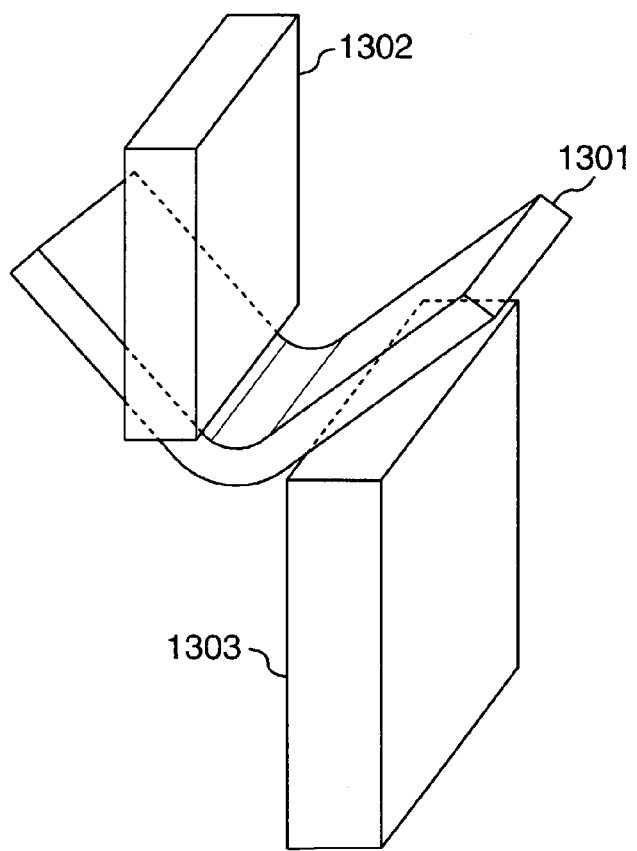
FIG. 13 is a perspective view showing an example of working means in bending working.
Figure 14:
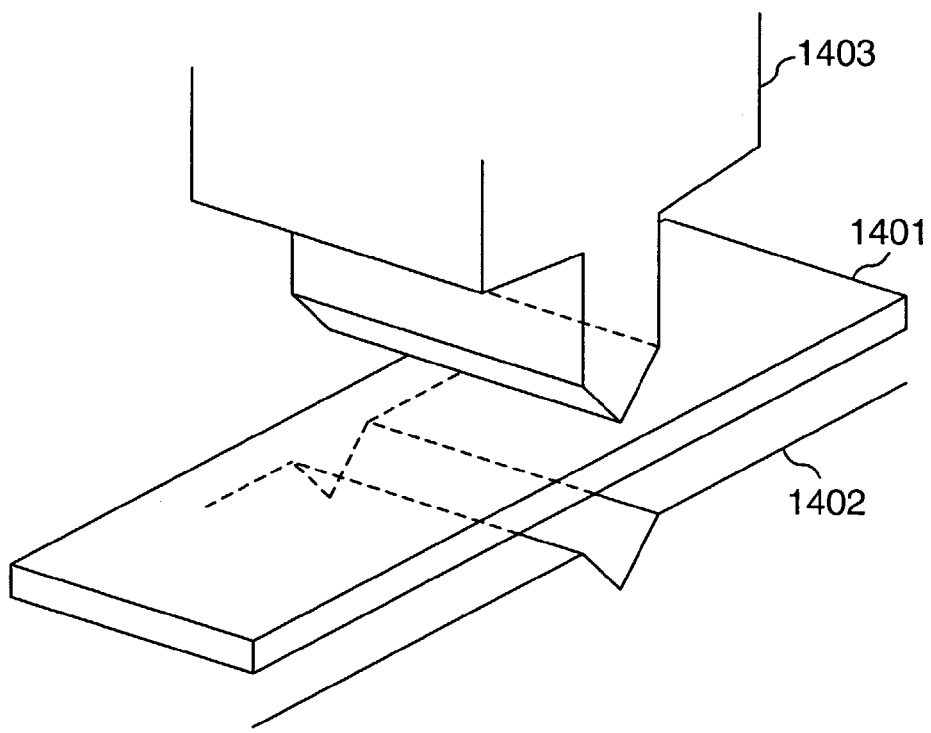
FIG. 14 is a perspective view showing another example of the working means in the bending working.

An example of a menu of groove working representing a special example in the case of cutting in the shape working operation is shown in FIG. 11. An example of a shape of an object subject to groove working is illustrated in FIG. 12. A groove 1201 of a constant width is cut through the use of a standardized tool. A practical operation is similar to typical cutting but for better understanding of design intention, a menu of working means is made to be abundant. An example of working means in bending working is illustrated in FIG. 13. In the case of the example shown in FIG. 13, a material 1301 to be worked is fixed with a jig and a tool 1302 is operated downwards or a tool 1303 is operated upwards to perform bending working. Another example of the working means in bending working is illustrated in FIG. 14. In the case of the example shown in FIG. 14, a material to be worked 1401 is placed on a rest 1402 formed with a groove in advance and an upper tool 1403 is thrust in for bending.

Figure 15:
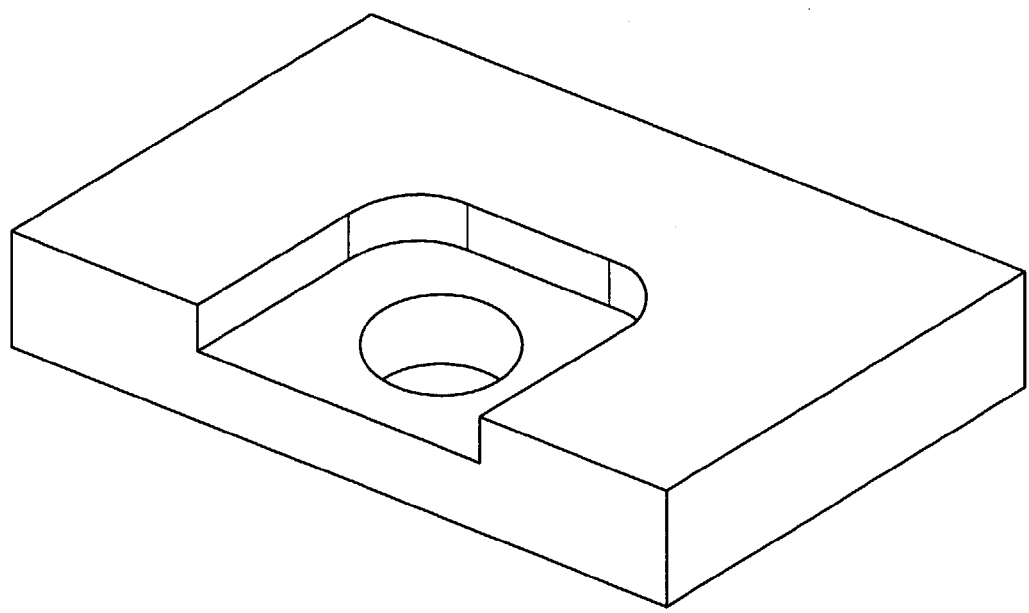
FIG. 15 is a perspective view showing an example of a shape worked through a plurality of working processes.
Figure 16:
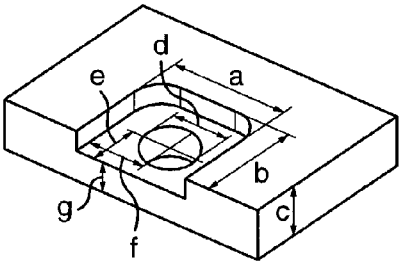
FIG. 16 is a diagram showing an example of a shape working menu.

As will be seen from FIGS. 13 and 14, similar bending can be worked using different tools and working methods. The working means is selectable in accordance with the size of a material to be worked, the required working accuracy and the working cost. In the bending working, too, working specifications are inputted by an operation similar to that in the case of the boring working menu and cutting working menu. If necessary for the purpose of obtaining a required bending angle, a combined working process may possibly be employed in which rough-machining is carried out with the means of FIG. 14 and thereafter the angle is adjusted finely with the means of FIG. 13. An example of a shape worked through a plurality of working processes is illustrated in FIG. 15 and an example of a shape working menu is shown in FIG. 16. A working process for such an unstandardized form as above may be acquired by using, for example, an external supplier. The designer need not be conscious of detailed processes and is simply required to input parameters such as analytical data of size necessary to obtain a final working shape.

The external data processing interface 112 in the external supplier publicizes the working shape the designer requires through the Internet, for instance. An information provider creates a concrete process (tools or the like to be used and operation) on the basis of a request by the designer and transfers it, along with information such as costs incurred in the production and accuracies, to the external data processing interface 112. As has already been described in connection with FIG. 4, the shape production process has a variety of patterns depending on the workability, working cost and working accuracy.

Figure 17:
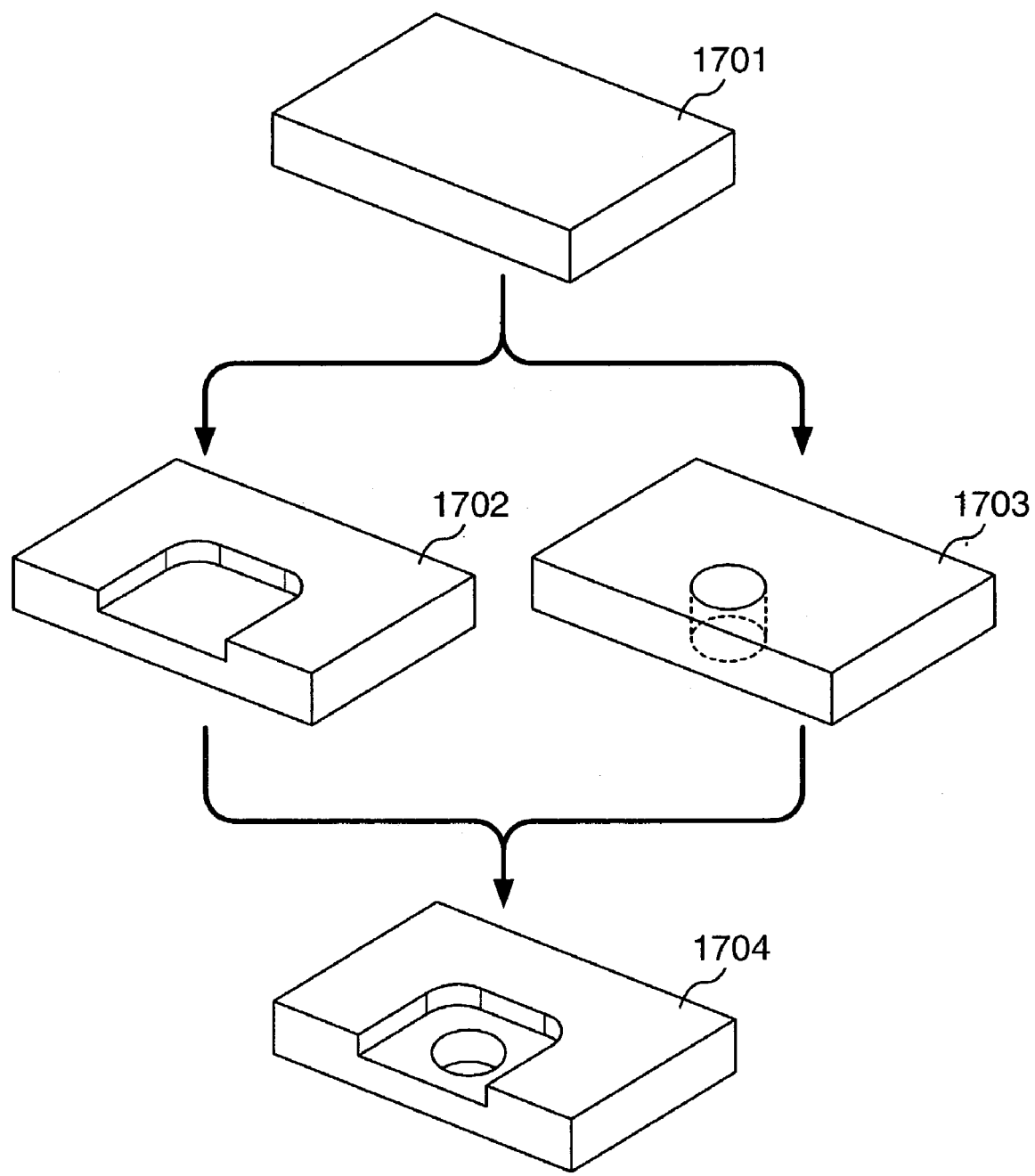
FIG. 17 is a diagram useful to explain different shape working processes.
Figure 18A:
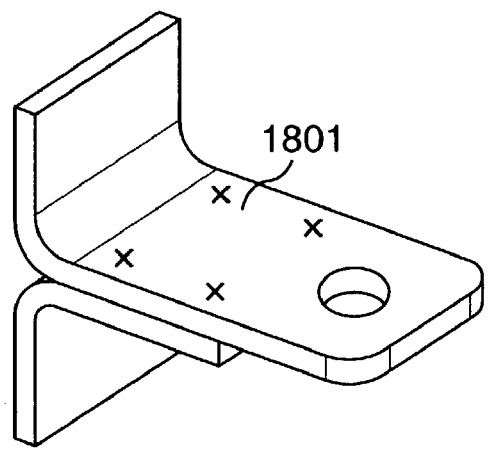
FIGS. 18A to 18D are perspective views showing examples of assembling process means.
Figure 18B:
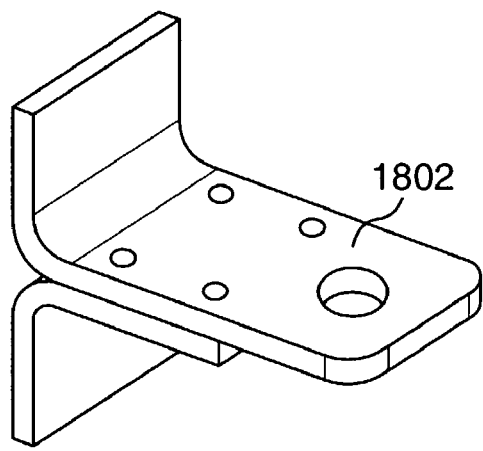
Figure 18C:
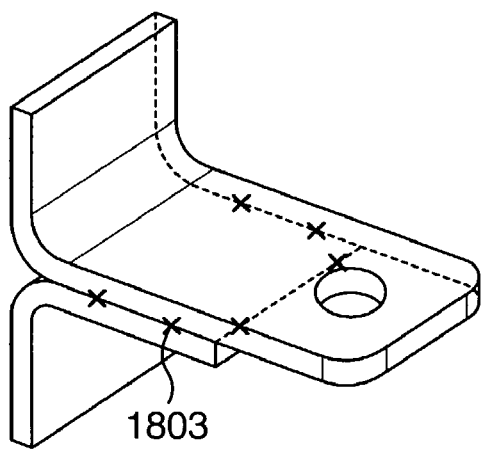
Figure 18D:
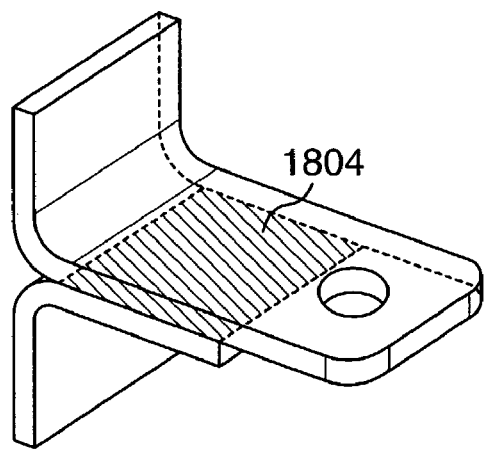

The different shape working processes are illustrated in FIG. 17. When an initial shape 1701 first undergoes cutting work, a shape 1702 follows and when the initial shape first undergoes boring work, a shape 1703 follows. With the shape 1702 bored or the shape 1703 cut in the subsequent process, a final shape 1704 can be obtained. Accordingly, the information such as the working cost and accuracy obtainable from the provider of the working process data is important and is necessary for the designer to retrieve required data from the database. Propriety of the collected process is verified by a means such as working simulation and thereafter registered in the operation means database 111. If necessary for comprehended use of the data accuracy and cost, it is possible to let the provider of the working process data offer data of tools to be used.

Referring to FIGS. 18A to 18D, examples of assembling process means are illustrated in perspective view form. In these examples, the shapes 201 and 202 as shown in FIG. 2 are put together by means of screwing, welding and bonding, respectively. In case screwing is selected as joint means, screw positions 1801 are designated. In the screwing, there need tapped holes and so boring working is carried out in this phase. The procedure for this purpose is similar to the previously-described boring working operation. After the boring working operation, a shape 1802 results. In the screwing, the quality of screws is registered as an attribute in the database, together with a cost incurred in the screwing joint. In case welding is selected as joint means, welding positions 1803 are designated. In the welding, the kind of welding is registered as an attribute of assembling means in the database, together with a cost incurred in the welding. In case bonding is selected as joint means, a bonding plane 1804 is designated. In the case of welding, bonding agent, curing time and strength after jointing are registered as an attribute of assembling means in the database, along with a cost incurred in the jointing. The designer consults these pieces of information to select a proper assembling method.

Figure 19:
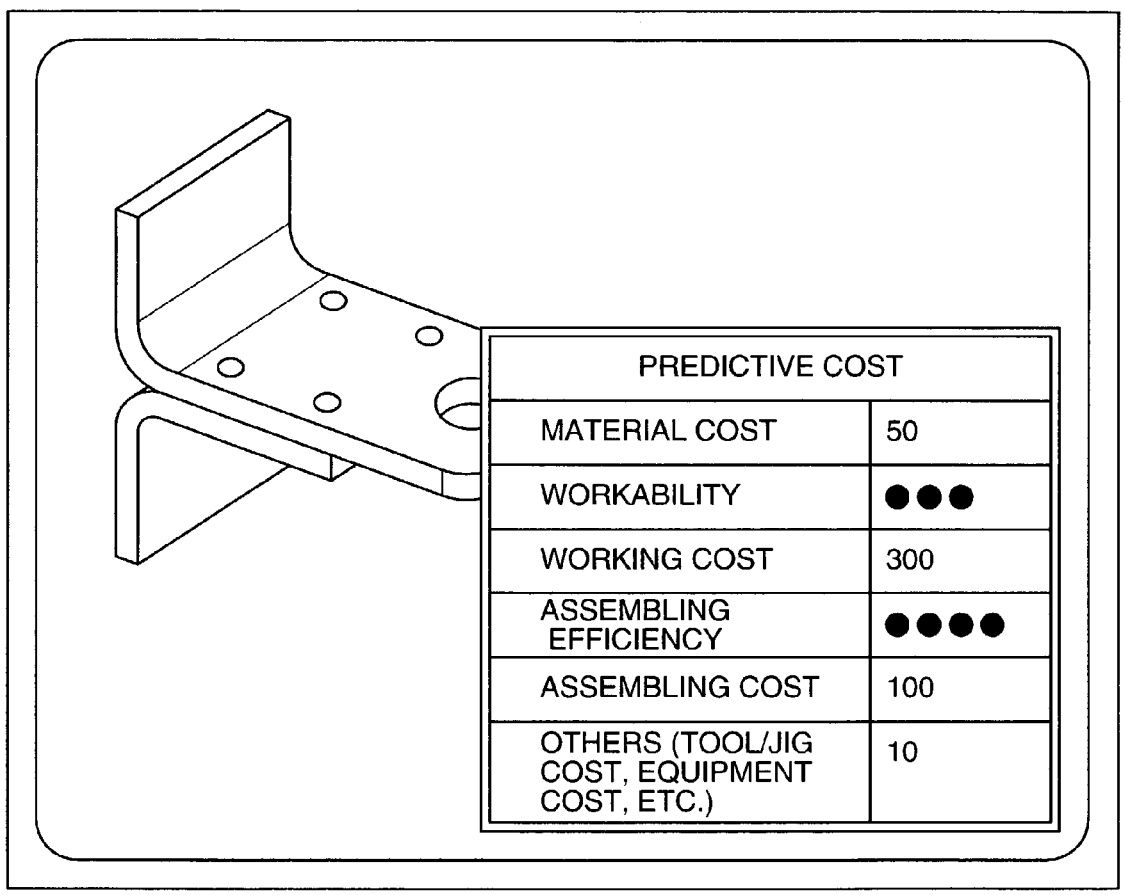
FIG. 19 is a diagram showing example of predictive costs of working/assembling displayed on a shape creation view.

Referring to FIG. 19, there is illustrated an example of a predictable cost of working/assembling displayed on a shape creation view. The cost of material is determined from, for example, quality of material of an object to be worked and its volume. A volume of a created shape can also be determined easily by using the function of the three-dimensional CAD. The workability is expressed by the ratio between the total number of working operations stored in the shape operation process editing unit 106 and the number of standard working operations. But, since all working operations do not have the same workability, weighting such as 5 points for bending working and 3 points for cutting working may be applied in accordance with the type of working means. In the example of FIG. 19, the workability is expressed in 5 grades, indicating that 3 symbols show standard, symbols less than three show bad workability and symbols more than three show good workability. The working cost is a total of working costs the individual working processes hold as attributes. The assembling efficiency is expressed by the ratio between the number of assembling operations for a symmetrical shape and the number of operations for standard assembling. The assembling cost is determined by determining a coefficient for conversion to a price from the number of standard assembling operations and the assembling cost thereof and then multiplying the current assembling efficiency by the coefficient. Other costs (costs of tools, jigs and equipments) are determined by sequentially adding values set in attributes of the shape operation process. The display method is similar to that in the case of the workability.

In any embodiment, the workability, assembling efficiency and cost of shapes concerning candidates for a plurality of working operations or assembling operations may, for example, be tabulated so as to provide a comparative display thereof. In this case, a plurality of operation processes are displayed comparatively and an optimum operation process the designer thinks on the basis of the order of any one of the workability, assembling efficiency and cost the designer thinks much of can be selected easily and can be reflected upon the succeeding CAM system or CAE system. According to the present embodiment, while creating a shape, the workability, assembling efficiency and cost obtained from concrete working means or assembling means can be confirmed in cooperation with the working operation such as boring, cutting and bending and the assembling operation such as connection, fitting and layout. Further, in the shape operation process editing unit 106, an influence of processes executed for addition, deletion and order change in the working/assembling process upon the workability, assembling efficiency and cost can be evaluated to thereby facilitate design changes.

According to the present invention, in the creation of shape data using the three-dimensional CAD, shape data is created by selecting the specific working means or assembling means having relation to the working accuracy, reliability and working cost in the working operation or assembling operation. Accordingly, a plurality of means for obtaining a final shape after working are selectable on the view and therefore the workability, assembling efficiency and cost determined in accordance with the specific working means or assembling means in cooperation with the working operation or assembling operation can be confirmed while creating the shape data. By using means for storing a plurality of shape operation processes and means for editing the plurality of shape operation processes, such processes as addition, deletion and order change of the shape operation process can be executed flexibly. As a result, a request for design change can be dealt with easily.

Since the shape data creating process created in the present CAD system has high cooperativeness with a practical product production process based on the NC machine utilizing CAM, the design intention can be shared by the design process and the product production process to facilitate reflection of the design intention upon the production field. Data of working means or assembling means the designer desires can be obtained easily by using the external supplier by way of the Internet or the like and therefore, update and expansion of the database can be permitted and more suitable working means or assembling means can be selected. When the workability, assembling efficiency and cost of shapes concerning candidates for a plurality of working operations or assembling operations are, for example, tabulated to provide a comparative display, an operation process can be selected easily which is considered to be the most suitable by the designer on the basis of the order or preferential turn of any one of the workability, assembling efficiency and cost the designer thinks much of and can be reflected upon the succeeding CAM system or CAE system.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A computer-implemented method for creating shape data by using three-dimensional CAD, comprising the steps of:
storing, in a database in advance, information of means which can used in operation of working or assembling and attributes of at least accuracy and cost of said operations of working assembling;
selecting information of said means stored in said database in accordance with a shape of an object to be created based on shape data created from said means;
determining attributes of accuracy and cost of the selected means if used by consulting said database; and
calculating at least one of workability, cost and assembling efficiency of creating the shape of the object based the consulted attributes,
wherein a procedure formed by operations is stored, at least one of addition or deletion of an operation and a change of an order of the operations in the stored procedure is executed and an evaluation value of an operation of a succeeding part of the order is determined in accordance with a value assigned to an operation at a preceding part of the order, and at least one of workability, cost and assembling efficiency is corrected and calculated from the evaluation value thus determined.

2. A shape data creating method according to claim 1, wherein created shape data and at least one of said calculated workability, cost and assembling efficiency of the shape are stored by making correspondence relationships therebetween.

3. A shape data creating method according to claim 1, wherein at least one of attributes of accuracy and cost is updated or expanded by consulting external data obtained through the Internet.

4. A shape data creating method according to claim 1, wherein a plurality of means which can be used are selected, attributes of accuracy and cost when the selected means are used are determined by consulting said database, at least one of workability, cost and assembling efficiency of making the shape is calculated based on the consulted attributes, and calculation results are displayed comparatively and differently with respect to different means being used.

5. A shape data creating method according to claim 2, wherein at least one of accuracy and cost is updated or expanded by consulting external data obtained through the Internet.

6. A shape data creating method according to claim 2, wherein a plurality of means are selected, attributes of accuracy and cost when said selected means are used are determined by consulting said database, at least one of workability, cost and assembling efficiency of the shape is calculated based on the consulted attributes, and calculation results are displayed comparatively and differently with respect to different means being used.

7. A apparatus for creating shape data by using three-dimensional CAD, comprising:
- an operation means database for storing in advance information of means which can be used in operations of working or assembling and attributes of at least accuracy and cost of operations of working or assembling;
- selecting means for selecting information of said means stored in said database in accordance with a shape of an object to be created based on created shape data from said means;
- totaling means for calculating at least one of workability, cost and assembling efficiency of the object by consulting said operation means database based on attributes of the selected means stored in said database;
- a process database for storing a procedure formed by operations; and
- shape operation process editing means for executing at least one of processes of addition or deletion of an operation and a change of an order of the operation in said procedure,
- wherein said totaling means determines an evaluation value of an operation of a succeeding part of the order in accordance with a value assigned to an operation at a preceding part of the order, and at least one of workability, cost and assembling efficiency is corrected and calculated from the evaluation value thus determined.

8. A shape data creating apparatus according to claim 7, further comprising:
- a shape database for storing created shape data and at least one of the calculated workability, cost and assembling efficiency of the shape by making correspondence relationships therebetween.

9. A shape data creating apparatus according to claim 7, further comprising:
- an external data processing interface for updating or expanding at least one of attributes of accuracy and cost of selected means by consulting external data obtained through the Internet.

10. A shape data creating apparatus according to claim 7, further comprising:
- display means for comparatively and differently displaying at least one of workability, cost and assembling efficiency of a plurality of means selected and obtained by said selecting means with respect to different selected means.

* * * * *